US010566716B2

(12) United States Patent
Kim

(10) Patent No.: US 10,566,716 B2
(45) Date of Patent: Feb. 18, 2020

(54) ISOLATION MECHANISM OF CONTROLLER FOR CIRCUIT BREAKER

(71) Applicant: LSIS CO., LTD., Anyang-si, Gyeonggi-do (KR)

(72) Inventor: Youngkook Kim, Anyang-si (KR)

(73) Assignee: LSIS CO., LTD., Anyang-si, Gyeonggi-Do (KR)

( * ) Notice: Subject to any disclaimer, the term of this patent is extended or adjusted under 35 U.S.C. 154(b) by 294 days.

(21) Appl. No.: 15/855,676

(22) Filed: Dec. 27, 2017

(65) Prior Publication Data

US 2018/0191091 A1    Jul. 5, 2018

(30) Foreign Application Priority Data

Dec. 29, 2016    (KR) .................. 10-2016-0182828

(51) Int. Cl.
*H01R 12/71*    (2011.01)
*H01H 9/54*    (2006.01)
(Continued)

(52) U.S. Cl.
CPC ............. *H01R 12/716* (2013.01); *H01H 9/54* (2013.01); *H01H 71/08* (2013.01); *H01H 71/123* (2013.01); *H01R 13/04* (2013.01); *H01R 13/10* (2013.01); *H01R 29/00* (2013.01); *H05K 1/18* (2013.01); *H01H 71/0228* (2013.01);
(Continued)

(58) Field of Classification Search
CPC ...... H01R 12/716; H01R 13/04; H01R 13/10; H01R 29/00; H01H 9/54; H01H 71/0228; H01H 71/08; H01H 71/123; H01H 71/128; H01H 71/7409; H01H 2071/086;
(Continued)

(56) References Cited

U.S. PATENT DOCUMENTS 4,181,389 A    1/1980 Kiesel
4,258,969 A    3/1981 Stallard

FOREIGN PATENT DOCUMENTS

CN    102904124 A    1/2013
CN    203014079 U    6/2013
(Continued)

OTHER PUBLICATIONS

Korean Office Action for related Korean Application No. 10-2016-0182828; action dated Jan. 22, 2018; (4 pages).
Chinese Office Action for related Chinese Application No. 201711449374.1; action dated Dec. 3, 2018; (12 pages).
European Search Report for related European Application No. 17205905.7; report dated Jun. 7, 2018; (7 pages).

*Primary Examiner* — Kevin J Comber
(74) *Attorney, Agent, or Firm* — K&L Gates LLP

(57) ABSTRACT

The present invention relates to an isolation mechanism of a controller for a direct current circuit breaker, which has a simple structure for isolation and connection manipulation. The isolation mechanism of a controller for a circuit breaker comprises a first connector that has a plurality of output terminals electrically connected to the controller and a plurality of input terminals detached from the output terminals for connecting an input electric power source; and a second connector that has a first connection position connected to the first connector and a second connection position rotated at 180° from the first connection position and connected to the first connector, and has a conductor wiring portion electrically connecting the output terminals with the input terminals at the first connection position and electrically disconnecting the output terminals from the input terminals at the second connection position.

8 Claims, 10 Drawing Sheets

(51) Int. Cl.
    *H05K 1/18*     (2006.01)
    *H01R 13/10*     (2006.01)
    *H01R 13/04*     (2006.01)
    *H01H 71/08*     (2006.01)
    *H01H 71/12*     (2006.01)
    *H01R 29/00*     (2006.01)
    *H01H 71/74*     (2006.01)
    *H01H 71/02*     (2006.01)

(52) U.S. Cl.
    CPC ....... *H01H 71/128* (2013.01); *H01H 71/7409* (2013.01); *H01H 2071/086* (2013.01); *H05K 2201/10045* (2013.01); *H05K 2201/10189* (2013.01)

(58) Field of Classification Search
    CPC ........... H05K 1/18; H05K 2201/10045; H05K 2201/10189
    USPC ......................................................... 361/170
    See application file for complete search history.

(56) References Cited

FOREIGN PATENT DOCUMENTS

| | | |
|---|---|---|
| CN | 104737146 A | 6/2015 |
| CN | 205645717 U | 10/2016 |
| EP | 0320409 A1 | 6/1989 |
| GB | 1514988 A | 6/1978 |
| JP | 2005026105 A | 1/2005 |
| JP | 2007166853 A | 6/2007 |
| JP | 2015106519 A | 6/2015 |
| KR | 100396816 B1 | 9/2003 |
| KR | 200432292 Y1 | 11/2006 |
| KR | 100823531 B1 | 4/2008 |
| KR | 20090019242 A | 2/2009 |
| KR | 101349659 B1 | 1/2014 |
| KR | 101541217 B1 | 8/2015 |
| KR | 101560660 B1 | 10/2015 |

ISOLATION MECHANISM OF CONTROLLER FOR CIRCUIT BREAKER

CROSS-REFERENCE TO RELATED APPLICATION

Pursuant to 35 U.S.C. § 119(a), this application claims the benefit of earlier filing date and right of priority to Korean Application No. 10-2016-0182828, filed on Dec. 29, 2016, the contents of which is incorporated by reference herein in its entirety.

BACKGROUND OF THE INVENTION

1. Field of the Invention

The present invention relates to a direct current circuit breaker (abbreviated as DC circuit breaker hereinafter), and more particularly, to an isolation mechanism for isolating a controller for the DC circuit breaker from an electric power source.

2. Description of the Conventional Art

As the controller of the DC circuit breaker, for example, DC air circuit breaker (generally, abbreviated as DC ACB), an over current relay (generally, abbreviated as OCR) converts (steps down) DC potential difference (voltage) between terminals located at the rear of the DC air circuit breaker, that is, between an anode terminal and a cathode terminal, which are connected to the electric power source side of a circuit, or between an anode terminal and a cathode terminal, which are connected to a load side of a circuit, and uses the converted DC potential difference (voltage) as a DC electric power source.

In such a DC air circuit breaker, the over current relay is always electrically connected to the above terminals to be provided with the DC electric power source. However, since a very great current such as 2500 A (ampere) is applied to the terminals during insulation test for the DC air circuit breaker, it is required to electrically separate (isolate) the over current relay from the terminals.

Therefore, an isolation mechanism of a controller for a DC circuit breaker is required as a means for electrically isolating (separating) the over current relay which is the controller from terminals during the test and electrically connecting the over current relay to the terminals at a normal status to supply a DC electric power source, that is, a selective ON/OFF means.

Meanwhile, an example of the isolation mechanism of a controller for a DC circuit breaker according to the conventional art will be described with reference to FIGS. 1 and 2.

The isolation mechanism of a controller for a DC circuit breaker according to the conventional art is a mechanism of which a width and a length are about 10 cm, respectively.

The isolation mechanism according to the conventional art comprises a pin type stationary contact 13, a movable contact 11c, a clip 11d for the movable contact, a threaded shaft 11a, a support nut 12, and a manipulation end portion 11b.

The stationary contact 13 is formed of an electric conductor and electrically connected to a terminal (not shown) of a DC circuit breaker.

The movable contact 11c is formed of an electric conductor and connected to the threaded shaft 11a to move in accordance with movement of the threaded shaft 11a that moves forward or backward. The movable contact 11c has a first position electrically connected to the stationary contact 13 and a second position electrically separated from the stationary contact 13.

The movable contact 11c is electrically connected to the controller for DC circuit breaker (not shown), that is, the over current relay through an electric power source line, for example.

The clip 11d is formed of an electric conductor and coupled to the movable contact 11c to move together with the movable contact 11c in accordance with back and forth movement of the movable contact 11c. The clip 11d can move to a position into which the stationary contact 13 is inserted and a position from which the stationary contact 13 is separated.

The threaded shaft 11a may be formed of an electric insulating material such as a synthetic resin material, meshed with the support nut 12, and move back and forth through the support nut 12 in accordance with clockwise or counterclockwise rotation.

The support nut 12 may also be formed of an electric insulating material such as a synthetic resin material, meshed with the threaded shaft 11a, and supports the threaded shaft 11a.

The manipulation end portion 11b is a portion for providing a manipulation portion to allow a user to move and manipulate the threaded shaft 11a, and is coupled to an opposite end portion of a portion of the threaded shaft 11a, which is connected with the movable contact 11c.

The manipulation end portion 11b may be provided with a "+" type driver coupling groove to which a screw driver can be coupled.

The operation of the above-described isolation mechanism of a controller for a DC circuit breaker according to the conventional art will be described.

First of all, the operation from the isolated state (OFF state) shown in FIG. 1 to the connected state (ON state) shown in FIG. 2 will be described.

In the isolated state (separated state or OFF state) shown in FIG. 1, if the screw driver is coupled to the manipulation end portion 11b and the user manipulates the manipulation end portion 11b clockwise, the threaded shaft 11a meshed with the support nut 12 moves forward while being rotated.

In this case, if the user more manipulates the manipulation end portion 11b clockwise through the screw driver, the threaded shaft 11a moves more forward, and the clip 11d becomes the state that the clip 11d is contacted with the stationary contact 13 by interposing the stationary contact 13 therebetween as shown in FIG. 2. As a result, the operation of the isolation mechanism from the isolated state (OFF state) to the connected state (ON state) is completed.

Next, the operation of the isolation mechanism from the connected state (ON state) shown in FIG. 2 to the isolated state (OFF state) shown in FIG. 1 will be described.

In the connected state (ON state) shown in FIG. 2, if the screw driver is coupled to the manipulation end portion 11b and the user manipulates the manipulation end portion 11b counterclockwise, the threaded shaft 11a meshed with the support nut 12 moves backward while being rotated.

In this case, if the user more manipulates the manipulation end portion 11b counterclockwise through the screw driver, the threaded shaft 11a moves more backward and the clip 11d becomes the state that the clip 11d is separated from the stationary contact 13 as shown in FIG. 1. As a result, the operation of the isolation mechanism from the connected state (ON state) to the isolated state (OFF state) is completed.

However, the above-described isolation mechanism of a controller for a DC circuit breaker according to the conventional art has a problem in that the threaded shaft 11a should rotatably move at a considerable range due to a distance for backward movement of the threaded shaft 11a for insulation between the stationary contact and the movable contact during isolation operation and relative much time is required.

Also, the above-described isolation mechanism of a controller for a DC circuit breaker according to the conventional art has inconvenience in manipulation in that a tool such as the screw driver should be used necessarily.

Also, the above-described isolation mechanism of a controller for a DC circuit breaker according to the conventional art has a problem in that components such as the support nut and the threaded shaft including an enclosure portion which is not shown are complicated.

SUMMARY OF THE INVENTION

Therefore, the present invention is to solve the aforementioned problems. An object of the present invention is to provide an isolation mechanism of a controller for a direct current circuit breaker, which has a simple structure and enables manipulation of connection to/isolation from an electric power source.

To achieve these and other objects and in accordance with the purpose of the present invention, as embodied and broadly described herein, according to the present invention, An isolation mechanism of a controller for a circuit breaker, comprising: a first connector that has a plurality of output terminals electrically connected to the controller and a plurality of input terminals detached from the output terminals for connecting an input electric power source; and a second connector that has a first connection position connected to the first connector and a second connection position rotated at 180° from the first connection position and connected to the first connector, and has a conductor wiring portion electrically connecting the output terminals with the input terminals at the first connection position and electrically disconnecting the output terminals from the input terminals at the second connection position.

According to one preferred aspect of the invention, the first connector further comprises a plurality of first invalid conductor wiring portions that are formed to be detached from the output terminals and the input terminals, having no electric connection with the output terminals and the input terminals, and the conductor wiring portion of the second connector comprises a plurality of connection wiring portions that connect the output terminals with the input terminals at the first connection position and connect the plurality of first invalid conductor wiring portions at the second connection position.

According to another preferred aspect of the invention, the second connector further comprises a plurality of second invalid conductor wiring portions that are connected to the first invalid conductor wiring portions at the first connection position and connected to the output terminals and the input terminals at the second connection position, and formed to be detached from one another.

According to still another preferred aspect of the invention, the first connector further comprises a pin connector portion for electric connection with the second connector, and the second connector further comprises a pin hole connector portion provided to correspond to the pin connector portion, capable of being connected to the pin connector portion at a first state or a second state rotated at 180° from the first state and capable of being detached from the pin connector portion.

According to still another preferred aspect of the invention, the first connector further comprises a first printed circuit board that has a plurality of first wiring portions electrically connected to the output terminals and the input terminals and the plurality of first invalid conductor wiring portions, and the second connector further comprises a second printed circuit board that has a plurality of connection wiring portions and the plurality of second invalid conductor wiring portions.

According to still another preferred aspect of the invention, the first connector comprises: a first printed circuit board that has having a plurality of first wiring portions electrically connected to the output terminals and the input terminals, and the plurality of first invalid conductor wiring portions; and an enclosure including a lower enclosure portion that receives the first printed circuit board and has an opened upper portion, and an upper enclosure portion that has a plurality of insulating partition walls and covers the lower enclosure portion, and is coupled to the lower enclosure portion.

According to still another preferred aspect of the invention, the second connector comprises: a second printed circuit board that has a plurality of connection wiring portions connecting the output terminals with the input terminals at the first connection position and connecting the plurality of first invalid conductor wiring portions with each other at the second connection position, and a plurality of second invalid conductor wiring portions connected to the first invalid conductor wiring portions at the first connection position and connected to the output terminals and the input terminals at the second connection position, and formed to be detached from each other; a plurality of connector portions that are electrically connected with the second printed circuit board and connected with the first connector; and a supporting frame that is coupled to the second printed circuit board, outwardly supports an assembly of the second printed circuit board and the connector portions.

According to still another preferred aspect of the invention, the supporting frame further comprises a pair of hook portions that are formed to be extended from both sides of the supporting frame to the front and thus elastically connected to the first connector.

According to still another preferred aspect of the invention, the supporting frame further comprises at least a pair of supporting protrusion portions that support the second printed circuit board by interposing the second printed circuit board therebetween.

According to still another preferred aspect of the invention, the supporting frame further comprises at least one connection protrusion portion that is provided on an inner wall and inserted into the second printed circuit board, and the second printed circuit board comprises a coupling hole portion that is provided to correspond to the connection protrusion portion and allows insertion of the connection protrusion portion.

BRIEF DESCRIPTION OF THE DRAWINGS

The accompanying drawings, which are included to provide a further understanding of the invention and are incorporated in and constitute a part of this specification, illustrate exemplary embodiments and together with the description serve to explain the principles of the invention.

In the drawings.

DETAILED DESCRIPTION OF THE INVENTION

The objects, features and advantages of the present invention will be clarified through following description of the preferred embodiments described with reference to the accompanying drawings.

Figure 1:
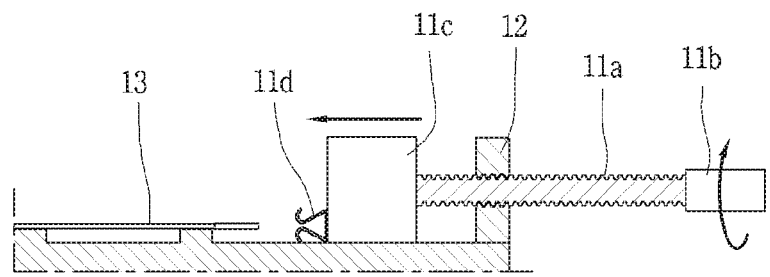
FIG. 1 is a view illustrating configuration and operation of an isolation mechanism of a controller for a DC circuit breaker according to the related art, especially an operate state view illustrating an operation state which is an isolated state (separated state or OFF state)
Figure 2:
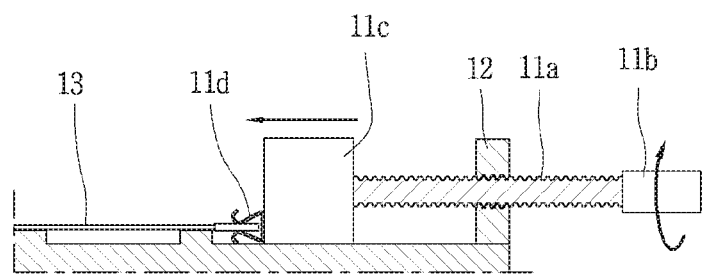
FIG. 2 is a view illustrating configuration and operation of an isolation mechanism of a controller for a DC circuit breaker according to the related art, especially an operate state view illustrating an operation state which is a connected state (ON state)
Figure 3:
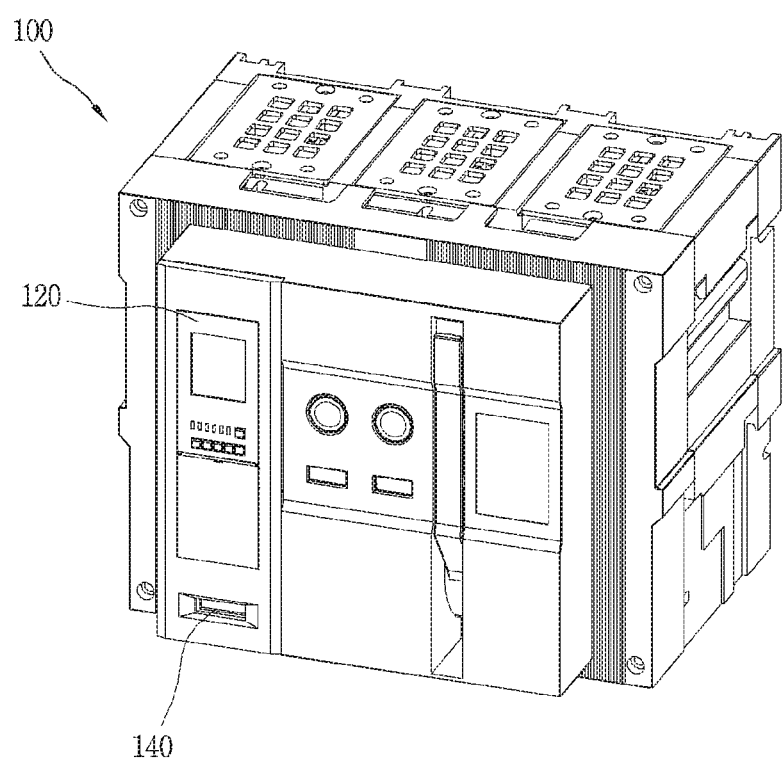
FIG. 3 is a perspective view illustrating external appearance of a DC circuit breaker provided with an isolation mechanism of a controller for a DC circuit breaker according to the preferred embodiment of the present invention.

FIG. 3 is a perspective view illustrating external appearance of a DC circuit breaker provided with an isolation mechanism of a controller for a DC circuit breaker according to the preferred embodiment of the present invention.

Referring to FIG. 3, the isolation mechanism 140 of a controller for a DC circuit breaker according to the present invention (hereinafter, abbreviated as isolation mechanism) may be provided below an over current relay (OCR) 120 which is the controller provided on a front surface of a main body 100 of the DC circuit breaker. This arrangement position is only exemplary, and the isolation mechanism 140 may be provided above or at a side of the over current relay 120.

Figure 4:
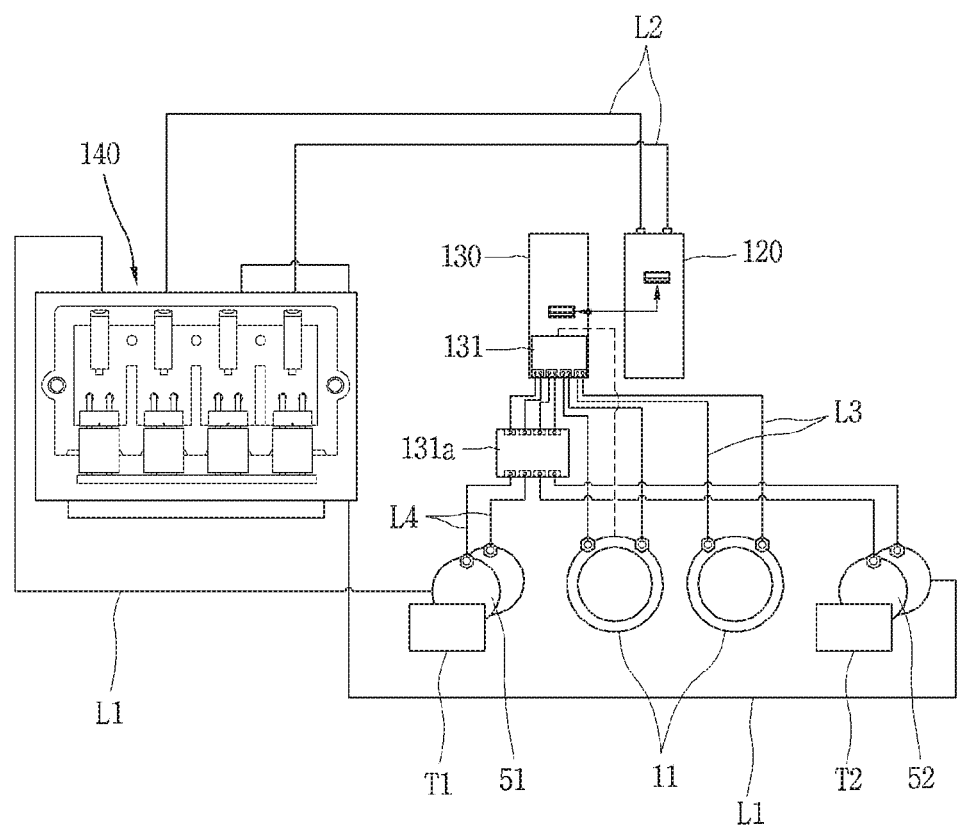
FIG. 4 is a wiring view illustrating electric connection of an isolation mechanism, a controller and a magnetic trip device in a DC circuit breaker including the isolation mechanism according to the preferred embodiment of the present invention.

FIG. 4 is a wiring view illustrating electric connection of an isolation mechanism, a controller and a magnetic trip device in a DC circuit breaker including the isolation mechanism according to the preferred embodiment of the present invention.

Functions and electric connection of the isolation mechanism 140 and its near devices in the DC circuit breaker will be described in brief with reference to FIG. 4.

FIG. 4 illustrates circuit configuration of electric components including a device for detecting the amount of electricity of a circuit connected to the DC circuit breaker, generating a trip control signal when the detected amount of electricity exceeds a reference value, generating a magnetic trip output in response to the trip control signal, and supplying or disconnecting an electric power source to or from the over current relay.

Main components of the electric components shown in FIG. 4 may correspond to the over current relay 120 and the magnetic trip device (abbreviated as MTD) 130.

The electric components shown in FIG. 4 further include a current transformer 11, a printed circuit board for magnetic trip device 131, an amplification circuit section 131a, signal lines L1, L2, L3 and L4, shunts (voltage detectors) 51 and 52, terminals T1 and T2 for anode and cathode, and the isolation mechanism 140.

The over current relay 120 is a device corresponding to the controller in the DC circuit breaker, and is a target device for action of the isolation mechanism 140 according to the present invention. The over current relay 120 is connected with the isolation mechanism 140 through the signal line L2 for power supply.

The magnetic trip device 130 is connected to the over current relay 120 through a signal line to provide a voltage detection signal and a current detection signal of the circuit to the over current relay 120, and can output a mechanical trip signal by means of (in response to) the trip control signal from the over current relay 120. The magnetic trip device 130 may include a coil magnetized by the trip control signal or demagnetized if there is no trip control signal, a mechanical output portion such as a plunger, which is driven by the coil, and a returning spring for returning the plunger to its original position when the coil is demagnetized. The magnetic trip device 130 includes the printed circuit board 131 having a circuit section for providing the voltage detection signal and the current detection signal of the circuit.

The printed circuit board 131 is connected to the shunts 51 and 52, which provide the voltage detection signal via the signal line L4 and the amplification circuit section 131a, and the printed circuit board 131 is connected to the current transformer 11 (or combination of Rogowski coil and current transformer), which provides the current detection signal of the circuit through the signal line L3.

The amplification circuit section 131a amplifies the voltage detection signal from the shunts 51 and 52 connected through the signal line L4 and then provides the amplified signal to the printed circuit board 131.

The signal lines include the signal line L1 which is a power signal line for supplying a DC power from the terminals T1 and T2 to the isolation mechanism 140, the signal line L2 for supplying a DC power to the over current relay 120 from the isolation mechanism 140, the signal line L3 for delivering the current detection signal from the current transformer 11 to the printed circuit board 131 of the magnetic trip device 130, and the signal line L4 for delivering the voltage detection signal from the shunts 51 and 52 to the amplification circuit section 131a.

The shunts 51 and 52 are installed in the terminals T1 and T2, detect voltages of the terminals T1 and T2, and provide the detected voltage signals to the amplification circuit section 131a through the signal line L4.

The current transformer 11 may be installed in a load side terminal of the terminals of the circuit breaker to detect a current of each of anode and cathode, and can provide the detected current.

The terminals T1 and T2 may represent power source side terminals (terminals for connecting a power source side electric line to the circuit breaker) among terminals of the circuit breaker, and two other terminals as load side terminals (terminals for connecting a load side electric line to the circuit breaker) are omitted. The terminals T1 and T2 may be provided in the form of a bus bar formed of a parallelepiped rod shaped metal conductive material.

The configuration and operation of the isolation mechanism 140 will be described in detail with reference to FIGS. 5 to 16.

The isolation mechanism of a controller for a DC circuit breaker according to the preferred embodiment of the present invention, that is, the isolation mechanism 140 comprises a first connector (see 144 of FIGS. 8 to 12) and a second connector (see 141-1 of FIGS. 9 to 12).

Figure 7:
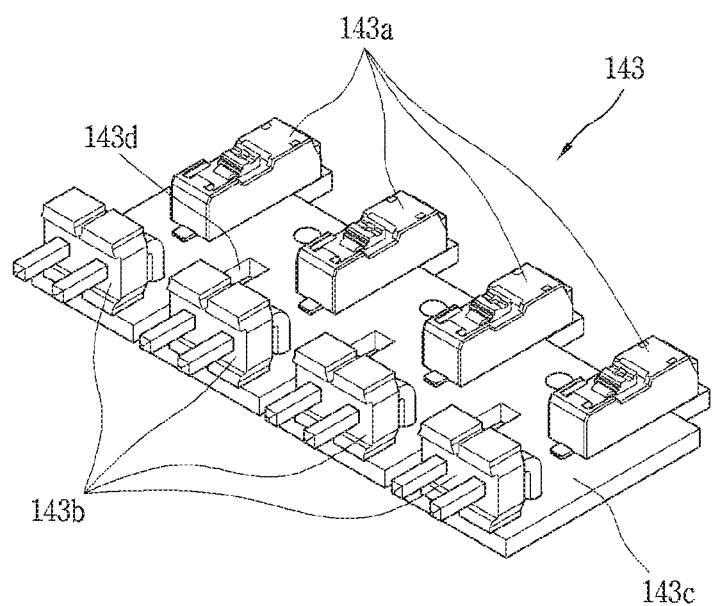
FIG. 7 is a perspective view illustrating external appearance of an assembly of a first printed circuit board of a first connector, a pin connector portion, an input terminal and an output terminal in a state that an enclosure of the isolation mechanism according to the preferred embodiment of the present invention is removed.
Figure 8:
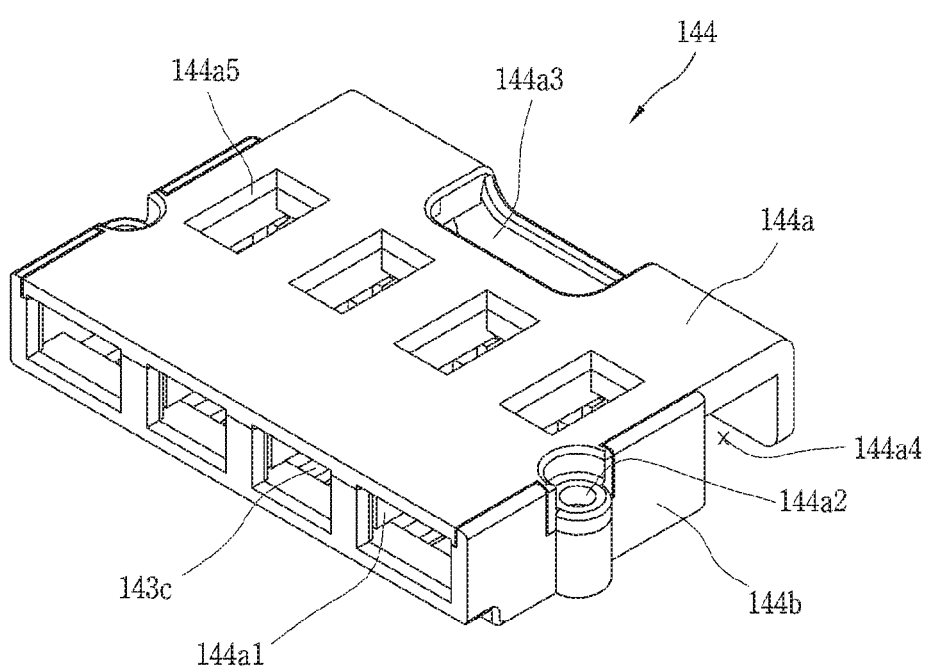
FIG. 8 is a perspective view illustrating an enclosure of the isolation mechanism according to the preferred embodiment of the present invention.

Referring to FIG. 7 to FIG. 8, the first connector 144 comprises a printed circuit board assembly (see 143 of FIG. 7) and enclosures (see 144a and 144b of FIG. 8).

Referring to FIG. 7, the printed circuit board assembly 143 of the first connector 144 comprises a first printed circuit board 143c and a plurality of pin connector portions 143b.

The plurality of pin connector portions 143b in the first connector 144 becomes connection means for electric connection with the second connector 141-1.

As shown in FIG. 8, in a state that the printed circuit board assembly 143 and the enclosures 144a and 144b are assembled, the plurality of pin connector portions 143b of the printed circuit board assembly 143 of the first connector 144 are not exposed to the outside of the enclosures 144a and 144b.

Also, as seen with reference to FIG. 7, the printed circuit board assembly 143 of the first connector 144 further comprises input and output terminals (line connector) 143a that may be connected to power signal lines (see L1 and L2 of FIG. 4) of power source side (terminal side of the circuit breaker) and load side (over current relay side).

The input and output terminals 143a can be configured with a connector called a line connector, wherein a Line-Trap SMT connector of Molex Corp., which may be purchased in the market, may be used as the line connector.

In accordance with one embodiment, the second one of the left-most side and the right-most one of four input and output terminals 143a of FIG. 7 are output terminals, and may be connected to the controller for a circuit breaker, that is, the over current relay (120 of FIG. 4) through the signal line (see L2 of FIG. 4) to supply a DC power to the over current relay 120. The left-most one and the second one of the right-most side of the four input and output terminals are input terminals, and may be connected to the terminals T1 and T2 of the circuit breaker or the shunts 51 and 52 through the signal line L1 to receive a DC power.

In one preferred aspect of the present invention, the first printed circuit board 143c may be provided with three assembly position determining through hole portions 143d for determining an assembly position in the lower enclosure portion 144b of the enclosures 144a and 144b. The lower enclosure portion 144b which will be described later may be provided with assembly protrusion portions (not shown) corresponding to the assembly position determining through hole portions 143d of the first printed circuit board 143c, wherein the assembly protrusion portions may be protruded upwardly from the bottom.

Electric configuration of the first printed circuit board 143c will be described with reference to FIGS. 13 to 16.

Figure 13:
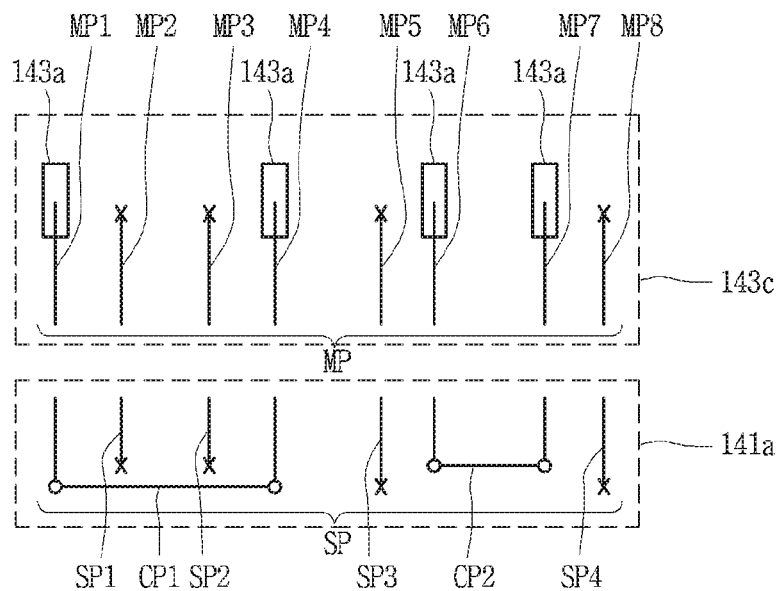
FIG. 13 is a circuit diagram illustrating an arrangement state of first and second connectors for connection to a first connection position, each of which has a printed circuit board of a circuit pattern according to the first embodiment in an isolation mechanism of the present invention.
Figure 15:
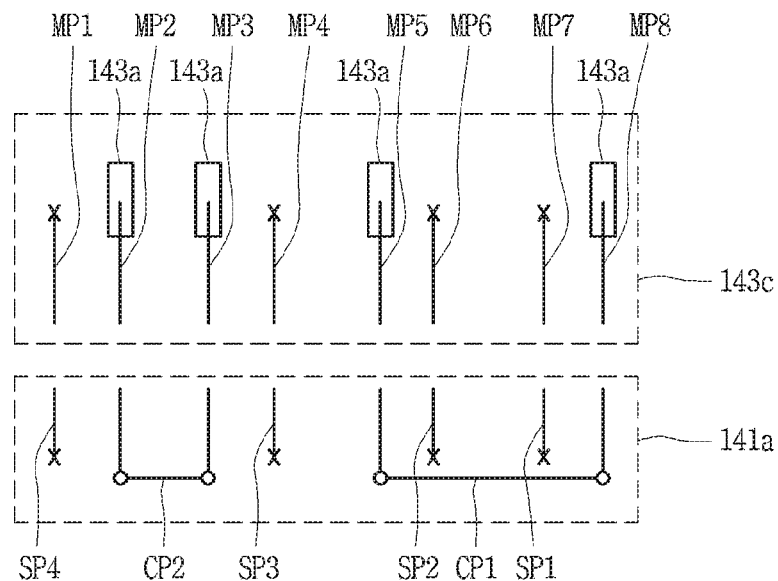
FIG. 15 is a circuit diagram illustrating an arrangement state of first and second connectors for connection to a first connection position, each of which has a printed circuit board of a circuit pattern according to the second embodiment in an isolation mechanism the present invention.

As seen with reference to FIG. 13 or 15, the first connector 144 has a plurality of output terminals (for example, see the second terminal of the left-most side indicated by 143a and the right-most terminal indicated by 143a in FIG. 13) electrically connected to the over current relay 120 which serves as the controller, and a plurality of input terminals (for example, see the left-most terminal indicated by 143a and the second terminal of the right-most side indicated by 143a in FIG. 13) formed separately from the output terminals without electric connection with the output terminals, for receiving an input power.

The output terminals may be connected to the controller, that is, the over current relay 120 through the signal line L2 in FIG. 4, and the input terminals may be connected to the terminals T1 and T2 of the circuit breaker or the shunts 51 and 52 through the signal line L1.

Figure 14:
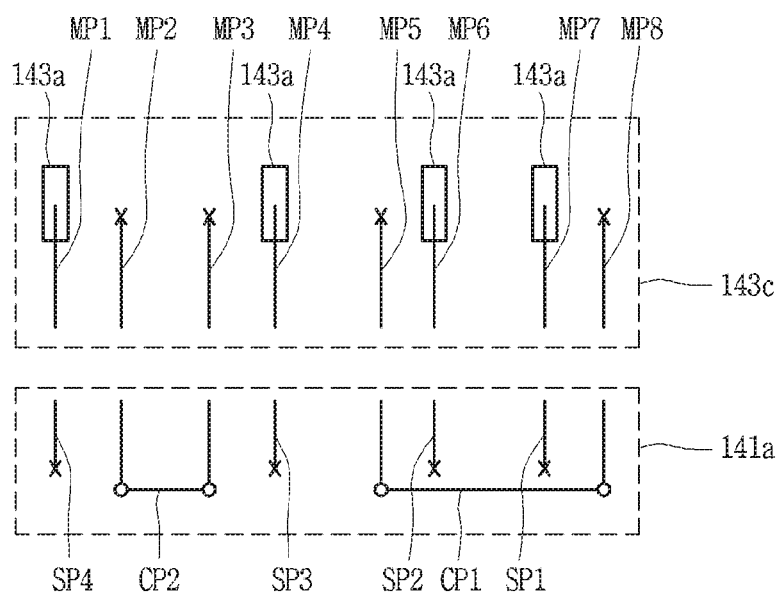
FIG. 14 is a circuit diagram illustrating an arrangement state of first and second connectors for connection to a second connection position, each of which has a printed circuit board of a circuit pattern according to the first embodiment in an isolation mechanism of a controller for a DC circuit breaker of the present invention.

In one embodiment shown in FIGS. 13 and 14, the first printed circuit board 143c has a plurality of first wiring portions MP1, MP4, MP6 and MP7 electrically connected to the output terminals and the input terminals, and a plurality of first invalid conductor wiring portions MP2, MP3, MP5 and MP8.

The plurality of first invalid conductor wiring portions MP2, MP3, MP5 and MP8 are formed to be separated from the output terminals and the input terminals, whereby there is no electric connection to the output terminals and the input terminals.

In FIG. 13, reference character MP designates a conductor wiring portion that comprises the plurality of first wiring portions MP1, MP4, MP6 and MP7 and the plurality of first invalid conductor wiring portions MP2, MP3, MP5 and MP8.

Figure 16:
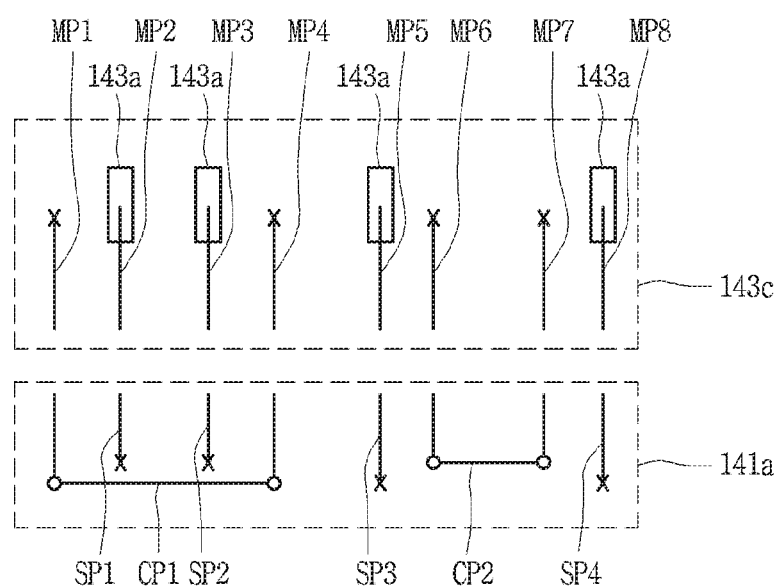
FIG. 16 is a circuit diagram illustrating an arrangement state of first and second connectors for connection to a second connection position, each of which has a printed circuit board of a circuit pattern according to the second embodiment in an isolation mechanism of a controller for a DC circuit breaker of the present invention.

In another embodiment shown in FIGS. 15 and 16, the first printed circuit board 143c has a plurality of first wiring portions MP2, MP3, MP5 and MP8 electrically connected to the output terminals and the input terminals, and a plurality of first invalid conductor wiring portions MP1, MP4, MP6 and MP7.

The plurality of first invalid conductor wiring portions MP1, MP4, MP6 and MP7 are formed to be separated from the output terminals and the input terminals, whereby there is no electric connection to the output terminals and the input terminals.

As seen with reference to FIG. 8, the enclosures 144a and 144b of the first connector 144 comprise the lower enclosure portion 144b for receiving the first printed circuit board 143c, having an upper portion which is opened, and the upper enclosure portion 144a having a plurality of insulating walls 144a1, covering the lower enclosure portion 144b, coupled to the lower enclosure portion 144b.

In FIG. 8, the upper enclosure portion 144a may be formed of a synthetic resin material having electric insulation, and comprises a plurality of (four) input and output terminal access allowable hole portions 144a5 formed at the center of an upper surface along a length direction.

The upper enclosure portion 144a comprises a center through hole portion 144a3 formed at the center of a rear edge on the upper surface to allow passing through of the signal lines L1 and L2, which will be connected with two center input and output terminals 143a of the input and output terminals.

The upper enclosure portion 144a has a bent portion formed as a rear portion is bent orthogonally, and comprises an outer through hole portion 144a4 for allowing penetration of the signal lines L1 and L2, which will be connected to two input and output terminals 143a at both outer sides of the input and output terminals, between the corresponding bent portion and a rear wall of the lower enclosure portion 144b.

Also, the upper enclosure portion 144a has a pair of threaded hole portions 144a2 at a predetermined position of both edges. The lower enclosure portion 144b also has threaded hole portions (no reference numeral is given) provided at a position corresponding to the threaded hole portions 144a2. Assembly of the upper enclosure portion 144a and the lower enclosure portion 144b can be accomplished by fastening of screws (not shown) to the corresponding threaded hole portions.

The lower enclosure portion 144b may be formed of a synthetic resin material having electric insulation, and may configured with a box type member having a rectangular cross-sectional shape, which has an opened upper surface, has a plurality of through hole portions on front and rear surfaces and receives the printed circuit board assembly 143.

Figure 5:
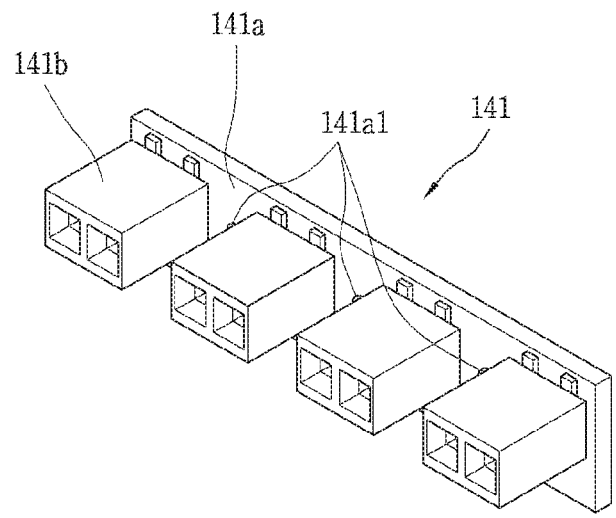
FIG. 5 is a perspective view illustrating an assembly of a connector portion of a second connector and a second printed circuit board in the isolation mechanism according to the preferred embodiment of the present invention.
Figure 6:
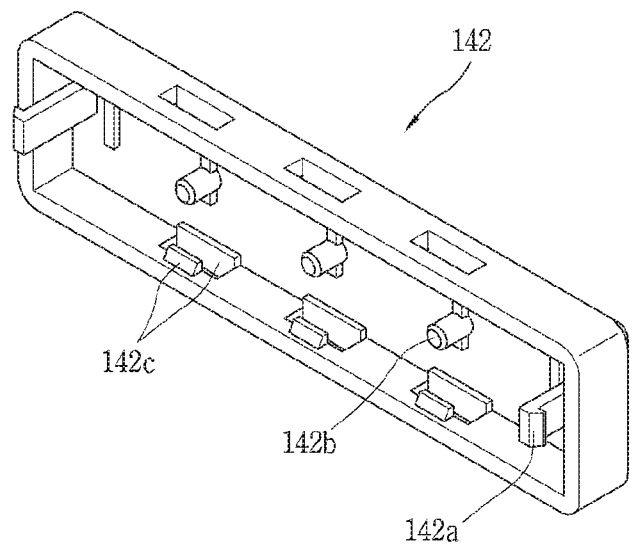
FIG. 6 is a perspective view illustrating a supporting frame of a second connector in the isolation mechanism according to the preferred embodiment of the present invention.

Meanwhile, the second connector 141-1 comprises the printed circuit board assembly 141 shown in FIG. 5, and the supporting frame 142 shown in FIG. 6.

The printed circuit board assembly 141 shown in FIG. 5 comprises a second printed circuit board 141a and a plurality of (four) pin hole connector portions 141b.

The pin hole connector portions 141b are provided to correspond to the pin connector portions 143b of the first connector 144, and may be connected to the pin connector portions 143b at a first state (see state of FIG. 11) or a second state (see state of FIG. 12) rotated at 180° from the first state, or may be detached(separated) from the pin connector portions 143b.

As shown in FIG. 6, the supporting frame 142 is coupled to the second printed circuit board 141a, and outwardly supports the assembly (the printed circuit board assembly 141 in FIG. 5) of the second printed circuit board 141a and the pin hole connector portion 141b.

As seen with reference to FIG. 6, the supporting frame 142 may be formed of a parallelepiped shape of which one surface (front surface in FIG. 6) is opened, which may provide a receiving space of the second printed circuit board 141a therein, and may be manufactured by molding synthetic resin having electric insulation.

As shown in FIG. 6, the supporting frame 142 comprises a pair of hook portions 142a, at least a pair of supporting protrusion portions 142c, and at least a pair of connection protrusion portions 142b.

Whereas the pin connector portions 143b and the pin hole connector portions 141b are means for electrically connecting the first connector 144 with the second connector 141-1, the pair of hook portions 142a may be provided in accordance with the preferred embodiment as means for mechanically maintaining the electric connection state of the first connector 144 and the second connector 141-1.

Step down portions (not shown) may be provided on an inner wall of the lower enclosure portion 144b of the first connector 144 to correspond to the pair of hook portions 142a of the second connector 141-1.

The pair of hook portions 142a are formed to be extended forward from both sides of the supporting frame 142, such that the hook portions 142a may elastically be connected to the first connector side (the step down portions).

A total of six pairs of the supporting protrusion portions 142c may be provided on an upper surface and a lower surface (bottom surface) and symmetrically inside the supporting frame 142 in accordance with the preferred embodiment.

Each pair of supporting protrusion portions 142c comprises a front inclined protrusion portion and a rear vertical protrusion portion higher than the front inclined protrusion portion. Each pair of supporting protrusion portions 142c may be formed to have a spaced distance obtained by adding assembly tolerance to a thickness of the second printed circuit board 141a, whereby the second printed circuit board 141a may be inserted between the inclined protrusion portion and the vertical protrusion portion.

The inclined protrusion portion may be formed such that heights from upper and lower surfaces inside the supporting frame 142 may become higher from the front to the rear to facilitate assembly of the second printed circuit board 141a.

The connection protrusion portion 142b may be formed on an inner wall of the supporting frame 142, especially rear inner wall. A plurality of (three in the embodiment) connection protrusion portions 142b may be provided to be protruded from the rear inner wall of the supporting frame 142 towards the front.

As seen with reference to FIG. 5, the second printed circuit board 141a may be provided with coupling hole portions 141a1 provided to correspond to the connection protrusion portions 142b, allowing insertion of the connection protrusion portions 142b.

Therefore, when assembly of the printed circuit board assembly 141 and the supporting frame 142 is completed, the supporting protrusion portion 142c may support the printed circuit board assembly 141 to prevent forward and backward movement of the printed circuit board assembly 141 (in other words, the second printed circuit board 141a) from occurring, and the connection protrusion portion 142b may support the printed circuit board assembly 141 to prevent left and right movement of the printed circuit board assembly 141 (in other words, the second printed circuit board 141a) from occurring.

The second connector 141-1 may have a first connection position (see position of FIG. 11 or position of FIG. 13) connected to the first connector 144 according to one embodiment and a second connection position (see position of FIG. 12 or position of FIG. 14) connected to the first connector 144 by rotation of 180° from the first connection position.

Also, the second connector 141-1 may have a first connection position (see position of FIG. 11 or position of FIG. 15) connected to the first connector 144 according to another embodiment and a second connection position (see position of FIG. 12 or position of FIG. 16) connected to the first connector 144 by rotation of 180° from the first connection position.

Electric configuration of the second printed circuit board 141a will be described with reference to FIGS. 13 to 16.

As seen with reference to FIG. 13, the second printed circuit board 141a has a conductor wiring portion SP.

The conductor wiring portion SP of the second connector 141-1 connects the output and input terminals of the first connector 144 with each other at the first connection position, and connects the plurality of first invalid conductor wiring portions MP2, MP3, MP5 and MP8 or MP1, MP4, MP6 and MP7 (in the embodiment of FIGS. 15 and 16) of the first connector 144 with one another at the second connection position.

As seen with reference to FIGS. 13 to 16, in the second printed circuit board 141a of the second connector 141-1, the conductor wiring portion SP has a plurality of (two) connection wiring portions CP1 and CP2 and a plurality of second invalid conductor wiring portions SP1, SP2, SP3 and SP4.

The connection wiring portions CP1 and CP2 connect the output and input terminals of the first connector 144 with each other at the first connection position and connects the plurality of first invalid conductor wiring portions (MP2, MP3, MP5 and MP8 in the embodiment of FIGS. 13 and 14 or MP1, MP4, MP6 and MP7 in the embodiment of FIGS. 15 and 16) of the first connector 144 with one another at the second connection position.

The plurality of second invalid conductor wiring portions SP1, SP2, SP3 and SP4 are connected to the plurality of first invalid conductor wiring portions (MP2, MP3, MP5 and MP8 in the embodiment of FIGS. 13 and 14 or MP1, MP4, MP6 and MP7 in the embodiment of FIGS. 15 and 16) of the first connector 144 at the first connection position, and are connected to the output and input terminals of the first connector 144 at the second connection position. Also, the plurality of second invalid conductor wiring portions SP1, SP2, SP3 and SP4 are formed to be detached(separated) from one another.

Meanwhile, the operation of the isolation mechanism of a controller for a DC circuit breaker according to the preferred embodiment of the present invention configured as above will be described with reference to FIGS. 8 to 16.

Figure 9:
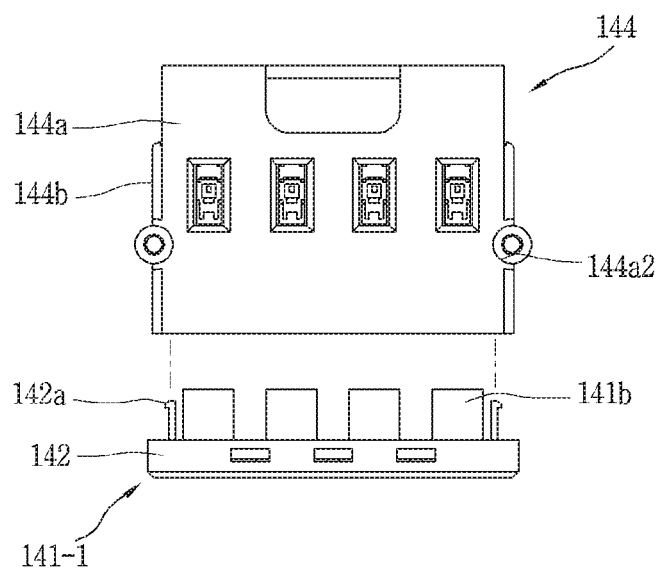
FIG. 9 is a plane view of the isolation mechanism illustrating a detached state that a first connector is separated from a second connector in the isolation mechanism according to the preferred embodiment of the present invention.
Figure 10:
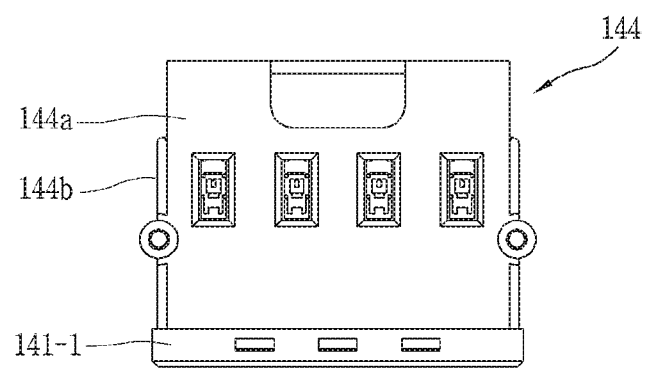
FIG. 10 is a plane view of the isolation mechanism illustrating a connected state that a first connector is connected to a second connector in the isolation mechanism according to the preferred embodiment of the present invention.
Figure 11:
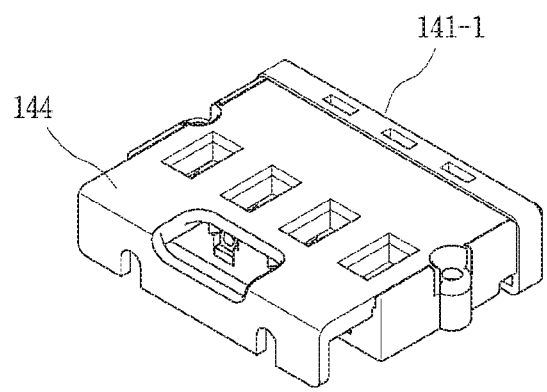
FIG. 11 is a perspective view of the isolation mechanism illustrating a connected state that a first connector is connected to a second connector at a first connection position in the isolation mechanism according to the preferred embodiment of the present invention.

In a state that the circuit breaker is normally operated, if the plurality of pin hole connectors 141b of the second connector 141-1 are pushed into a plurality of openings in front of the first connector 144 of FIG. 8 in the state of FIG. 9 when a user grips both sides of the second connector 141-1, the plurality of pin hole connectors 141b of the second connector 141-1 are connected with the plurality of pin connectors 143b of the first connector 144, whereby the first connection position becomes the state of FIG. 10 that the second connector 141-1 is connected to the first connector 144 at the first connection position and at the same time becomes the state shown in FIG. 11.

If the first connection position which is the state of FIG. 10 and at the same time the state shown in FIG. 11 is provided, the first printed circuit board 143c which is the electric component of the first connector 144 and the second printed circuit board 141a which is the electric component of the second connector 141-1 are connected as shown in FIG. 13 or FIG. 15.

Therefore, as shown in FIG. 13, in the first printed circuit board 143c which is the electric component of the first connector 144, output terminal 1 (the second terminal from the most-left side indicated by 143a) and input terminal 1 (the most-left terminal indicated by 143a) are connected with each other by a connection line portion 1 (CP1) in the second printed circuit board 143a which is the electric component of the second connector 141-1. In the first printed circuit board 143c, output terminal 2 (the most-right terminal indicated by 143a) and input terminal 2 (the second terminal from the most-right side indicated by 143a) are connected with each other by a connection line portion 2 (CP2) in the second printed circuit board 141a.

This means that the output terminal and the input terminal are connected with each other in the first printed circuit board 143c which is the electric component of the first connector 144. Therefore, the DC power from the terminals T1 and T2 of the circuit breaker or the shunts 51 and 52 via the input terminals 1 and 2 may be supplied to the over current relay 120 which is the controller of the circuit breaker, via the output terminals 1 and 2.

Meanwhile, if the over current relay 120 of the circuit breaker is required to be electrically detached (isolated) from the terminals T1 and T2 like an insulation test for the DC air circuit breaker, the user connects the second connector 141-1 to the first connector 144 by rotating the second connector 141-1 at 180° from the state shown in FIG. 13 in a state the second connector 141-1 is detached from the first connector 144. The connection method is as described above.

Figure 12:
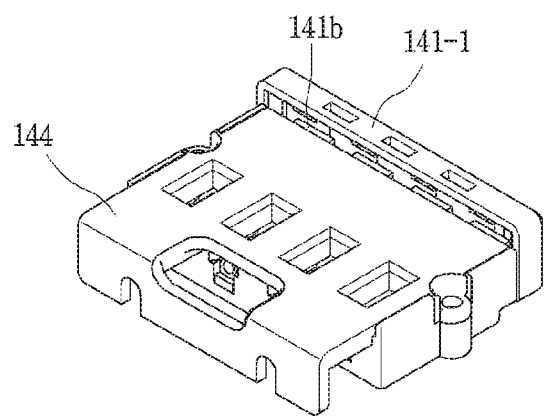
FIG. 12 is a perspective view illustrating a connected state that a first connector is connected to a second connector at a second connection position in the isolation mechanism according to the preferred embodiment of the present invention.

Then, an external connection state of the first connector 144 and the second connector 144-1 becomes the state shown in FIG. 12, and the electric connection state of the first connector 144 and the second connector 141-1 becomes the state shown in FIG. 14.

That is, as shown in FIG. 14, in the first printed circuit board 143c which is the electric component of the first connector 144, output terminal 1 (the second terminal from the most-left side indicated by 143a) and input terminal 1 (the most-left terminal indicated by 143a) are respectively connected with the second invalid conductor wiring portion 3 (SP3) and the second invalid conductor wiring portion 4 (SP4) in the second printed circuit board 141a which is the electric component of the second connector 141-1. In the first printed circuit board 143c, the first invalid conductor wiring portion 1 (MP2) and the first invalid conductor wiring portion 2 (MP3) are connected with each other by the connection line portion 2 (CP2) in the second printed circuit board 141a of the second connector 141-1. At the same time, in the first printed circuit board 143c, output terminal 2 (the most-right terminal indicated by 143a) and input terminal 2 (the second terminal from the most-right side indicated by 143a) are respectively connected with the second invalid conductor wiring portion 1 (SP1) and the second invalid conductor wiring portion 2 (SP2) in the second printed circuit board 141a. In the first printed circuit board 143c, the first invalid conductor wiring portion 3 (MP5) and the first invalid conductor line 4 (MP8) are connected with each other by the connection line portion 1 (CP1) in the second printed circuit board 141a.

This means that the output terminals 1 and 2 and the input terminals 1 and 2 in the first printed circuit board 143c which are the electric components of the first connector 144 are connected to the second invalid conductor wiring portions of the second printed circuit board 141a, which are detached (separated) from one another, whereby the output terminals and the input terminals are detached from one another. Therefore, the DC powers from the terminals T1 and T2 of the circuit breaker or the shunts 51 and 52, which are supplied to the input terminals 1 and 2 of the first connector 144, are detached(separated) from the output terminals 1 and 2, DC power supply to the over current relay 120 which is the controller of the circuit breaker is cut off(broken).

Therefore, since the over current relay 120 can be isolated in a state that a large current for insulation test is supplied to the terminals T1 and T2 of the circuit breaker, the over current relay 120 can be protected.

Meanwhile, in other embodiment different from the wiring configuration of the first printed circuit board 143c which is the electric component of the first connector 144 shown in FIGS. 15 and 16, when the second connector 141-1 is rotated at 180° as shown in FIG. 14 and connected to the first connector 144 as shown in FIG. 15, the output terminals 1 and 2 can be connected with the input terminals 1 and 2 to be the first connection position and the DC power from the terminals T1 and T2 of the circuit breaker or the shunts 51 and 52 can be supplied to the over current relay 120, which is the controller of the circuit breaker, through the output terminals 1 and 2.

In other embodiment different from line configuration of the first printed circuit board 143c which is the electric component of the first connector 144 shown in FIGS. 15 and 16, when the second connector 141-1 is rotated at 180° from the state of FIG. 15 and connected to the first connector 144 as shown in FIG. 13 or FIG. 16, the DC powers from the terminals T1 and T2 of the circuit breaker or the shunts 51 and 52, which are supplied to the input terminals 1 and 2 of the first connector 144 to be the second connection position, are detached(separated) from the output terminals 1 and 2, whereby DC power supply to the over current relay 120 is cut off(broken).

Technical effect of the isolation mechanism of a controller for a circuit breaker according to the present invention will be described as follows.

As described above, the isolation mechanism of a controller for a circuit breaker according to the present invention comprises a first connector that has a plurality of output terminals electrically connected to the controller and a plurality of input terminals detached from the output terminals for connecting an input electric power source; and a second connector that has a first connection position connected to the first connector and a second connection position rotated at 180° from the first connection position and connected to the first connector, and has a conductor wiring portion electrically connecting the output terminals with the input terminals at the first connection position and electrically disconnecting the output terminals from the input terminals at the second connection position. Therefore, as the second connector is connected to the first connector at the first connection position, the input power may be supplied to the controller. Also, as the second connector is connected to the first connector at the second connection position rotated at 180° from the first connection position, the power supply to the controller can conveniently be cut off(broken).

In the isolation mechanism of a controller for a circuit breaker according to the present invention, the first connector further comprises a plurality of first invalid conductor wiring portions formed to be detached from the output terminals and the input terminals, having no electric connection with the output terminals and the input terminals, and the second connector comprises a plurality of connection wiring portions connecting the output terminals with the input terminals at the first connection position and connecting the plurality of first invalid conductor wiring portions at the second connection position. Therefore, since the output terminals and the input terminals of the first connector are electrically connected with each other at the first connection position by the connection wiring portions of the second connector, electric power can be supplied to the controller for the circuit breaker. Since the connection wiring portions of the second connector are connected with the first invalid conductor wiring portions of the first connector at the second connection position, the output terminals and the input terminals of the first connector are electrically separated from each other, whereby power supply to the controller of the circuit breaker can be cut off(broken).

In the isolation mechanism of a controller for a circuit breaker according to the present invention, the second connector further comprises a plurality of invalid connection wiring portions connected to the first invalid conductor wiring portions at the first connection position and connected to the output terminals and the input terminals at the second connection position, and the plurality of invalid connection wiring portions are formed to be detached from one another. Therefore, if the first invalid conductor wiring portions of the first connector are connected to the invalid connection wiring portions at the first connection position or the output terminals and the input terminals of the first connector are connected to the invalid connection wiring portions of the second connector at the second connection position, the output terminals and the input terminals of the first connector can electrically be detached (disconnected) from each other.

In the isolation mechanism of a controller for a circuit breaker according to the present invention, the first connector further comprises a pin connector portion for electric connection with the second connector, and the second connector further comprises a pin hole connector portion provided to correspond to the pin connector portion, the pin hole connector portion is capable of being connected to the pin connector portion at a first state or a second state rotated at 180° from the first state and capable of being detached from the pin connector portion. Therefore, since the first connection position or the second connection position of the first connector and the second connector can be obtained by simple connection of the pin connector portion and the pin hole connector portion, power supply to the controller or cut off of the power supply to the controller can be conveniently be accomplished.

In the isolation mechanism of a controller for a circuit breaker according to the present invention, the first connector further comprises a first printed circuit board having a plurality of first wiring portions electrically connected to the input/output terminals and a plurality of first invalid conductor wiring portions, and the second connector further comprises a second printed circuit board having a plurality of connection wiring portions and a plurality of invalid connection wiring portions connected to the invalid conductor wiring portions at the first connection position, and the plurality of invalid connection wiring portions connected to the input/output terminals at the second connection position, and the plurality of invalid connection wiring portions being formed to be detached(separated) from each other. Therefore, the output terminals and the input terminals of the first connector are electrically connected with each other at the first connection position by the connection wiring portions of the second printed circuit board, whereby DC electric power can be supplied to the controller for the circuit breaker. The output terminals and the input terminals of the first connector are connected to the invalid connection wiring portions, which are separated from each other, at the second connection position, whereby the output terminals are separated from the input terminals and thus DC electric power supplied to the controller for the circuit breaker is cut off(broken).

In the isolation mechanism of a controller for a circuit breaker according to the present invention, the first connector comprises a first printed circuit board having a plurality of first wiring portions electrically connected to the input/output terminals and a plurality of first invalid conductor wiring portions; and an enclosure including a lower enclosure portion that receives the first printed circuit board and has an opened upper portion, and an upper enclosure portion that has a plurality of insulating walls, covers the lower enclosure portion and is coupled to the lower enclosure portion. Therefore, the printed circuit board of the first connector can be received in and protected by the enclosure.

In the isolation mechanism of a controller for a circuit breaker according to the present invention, the second connector comprises a second printed circuit board having a plurality of connection wiring portions that electrically connects the output terminals with the input terminals at the first connection position and electrically connects the plurality of invalid conductor wiring portions with each other at the second connection position, and a plurality of second invalid conductor wiring portions that is connected to the first invalid conductor wiring portions at the first connection position and connected to the output terminals and the input terminals at the second connection position, and is formed to be separated from each other; a plurality of connector portions electrically connected with the second printed circuit board and connected with the first connector; and a supporting frame that is coupled to the second printed circuit board and outwardly supports an assembly of the second printed circuit board and the connector portions. Therefore, as the assembly of the second printed circuit board and the connector portions of the second connector is outwardly supported by the supporting frame, a final assembly of the second connector can be formed.

In the isolation mechanism of a controller for a circuit breaker according to the present invention, since the supporting frame further comprises a pair of hook portions formed to be extended from both sides of the supporting frame to the front and thus elastically connected to the first connector side, the hook portions are inserted to coupling groove portions (not shown) formed on an inner wall of the enclosure of the first connector, whereby connection of the first connector and the second connector can be maintained more firmly.

In the isolation mechanism of a controller for a circuit breaker according to the present invention, since the supporting frame further comprises a pair of supporting protrusion portions, the second printed circuit board is interposed between the pair of supporting protrusion portions, whereby the second printed circuit board can be supported to be prevented from forward and backward moving.

In the isolation mechanism of a controller for a circuit breaker according to the present invention, since the supporting frame further comprises at least one connection protrusion portion provided on an inner wall and inserted into the second printed circuit board, and the second printed circuit board comprises a coupling hole portion provided to correspond to the connection protrusion portion, allowing insertion of the connection protrusion portion. Therefore, the connection protrusion portion can be inserted into the coupling hole portion to support the second printed circuit board to prevent left and right movement from occurring.

What is claimed is:

1. A circuit breaker comprising a controller and an isolation mechanism of the controller, comprising:
    a first connector that has a plurality of output terminals electrically connected to the controller and a plurality of input terminals detached from the output terminals for connecting an input electric power source; and
    a second connector that has a first connection position connected to the first connector and a second connection position rotated at 180° from the first connection position and connected to the first connector, and has a conductor wiring portion electrically connecting the output terminals with the input terminals at the first connection position and electrically disconnecting the output terminals from the input terminals at the second connection position;
    wherein the first connector further comprises a plurality of first invalid conductor wiring portions that are formed to be detached from the output terminals and the input terminals, having no electric connection with the output terminals and the input terminals, and the conductor wiring portion of the second connector comprises a plurality of connection wiring portions that connect the output terminals with the input terminals at the first connection position and connect the plurality of first invalid conductor wiring portions at the second connection position; and
    wherein the second connector further comprises a plurality of second invalid conductor wiring portions that are connected to the first invalid conductor wiring portions at the first connection position and connected to the output terminals and the input terminals at the second connection position, and formed to be detached from one another.

2. The circuit breaker of claim 1, wherein the first connector further comprises a pin connector portion for electric connection with the second connector, and
    the second connector further comprises a pin hole connector portion provided to correspond to the pin connector portion, capable of being connected to the pin connector portion at a first state or a second state rotated at 180° from the first state and capable of being detached from the pin connector portion.

3. The circuit breaker of claim 1, wherein the first connector further comprises a first printed circuit board that has a plurality of first wiring portions electrically connected to the output terminals and the input terminals and the plurality of first invalid conductor wiring portions, and
    the second connector further comprises a second printed circuit board that has a plurality of connection wiring portions and the plurality of second invalid conductor wiring portions.

4. The circuit breaker of claim 1, wherein the first connector comprises:

a first printed circuit board that has a plurality of first wiring portions electrically connected to the output terminals and the input terminals, and the plurality of first invalid conductor wiring portions; and an enclosure including a lower enclosure portion that receives the first printed circuit board and has an opened upper portion, and an upper enclosure portion that has a plurality of insulating partition walls and covers the lower enclosure portion, and is coupled to the lower enclosure portion.

5. The circuit breaker of claim 1, wherein the second connector comprises:

a second printed circuit board that has a plurality of connection wiring portions connecting the output terminals with the input terminals at the first connection position and connecting the plurality of first invalid conductor wiring portions with each other at the second connection position, and a plurality of second invalid conductor wiring portions connected to the first invalid conductor wiring portions at the first connection position and connected to the output terminals and the input terminals at the second connection position, and formed to be detached from each other;

a plurality of connector portions that are electrically connected with the second printed circuit board and connected with the first connector; and a supporting frame that is coupled to the second printed circuit board, outwardly supports an assembly of the second printed circuit board and the connector portions.

6. The circuit breaker of claim 5, wherein the supporting frame further comprises a pair of hook portions that are formed to be extended from both sides of the supporting frame to the front and thus elastically connected to the first connector.

7. The circuit breaker of claim 5, wherein the supporting frame further comprises at least a pair of supporting protrusion portions that support the second printed circuit board by interposing the second printed circuit board therebetween.

8. The circuit breaker of claim 5, wherein the supporting frame further comprises at least one connection protrusion portion that is provided on an inner wall and inserted into the second printed circuit board, and the second printed circuit board comprises a coupling hole portion that is provided to correspond to the connection protrusion portion and allows insertion of is the connection protrusion portion.

* * * * *